US006383874B1

(12) United States Patent
Sun et al.

(10) Patent No.: US 6,383,874 B1
(45) Date of Patent: May 7, 2002

(54) IN-SITU STACK FOR HIGH VOLUME PRODUCTION OF ISOLATION REGIONS

(75) Inventors: Sey-Ping Sun, Austin; Mark I. Gardner, Cedar Creek; Robert W. Anderson, Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/800,862

(22) Filed: Mar. 7, 2001

(51) Int. Cl.[7] .............................................. H01L 21/336

(52) U.S. Cl. ........................ 438/287; 438/638; 438/435; 324/719; 257/190

(58) Field of Search .................. 438/287, 638, 438/435; 324/719; 257/190

(56) References Cited

U.S. PATENT DOCUMENTS

| 4,943,344 | A |   | 7/1990  | Tachi et al. ............... 156/643 |
| 5,023,561 | A | * | 6/1991  | Hillard ....................... 324/719 |
| 5,411,913 | A |   | 5/1995  | Bashir et al. ................ 437/67 |
| 5,854,137 | A |   | 12/1998 | Kuo ............................ 438/714 |
| 5,914,280 | A |   | 6/1999  | Gelzinis ..................... 438/734 |
| 6,218,268 | B1 | * | 4/2001 | Xia et al. .................... 438/435 |
| 6,287,962 | B1 | * | 9/2001 | Lin ............................. 438/638 |
| 6,298,079 | B1 | * | 10/2001 | Tanaka et al. ............... 372/46 |
| 6,310,367 | B1 | * | 10/2001 | Yagichita et al. .......... 257/190 |

OTHER PUBLICATIONS

U.S. application No. 09/875,681, Sey–Ping Sun et al., filed Jun. 6, 2001.
Christopher P. D'Emic et al.; Deep trench plasma etching of single crystal silicon using $SF_6/O_2$ gas mixtures; Journal of Vacuum Science & Technology B, pp. 1105–1111; May/Jun. 1992.
The University of Reading, Substrate Optical Properties—http://www.cyber.reading.ac.uk/ISP/infrared/technical_data/substrate_optical_pro. . . /, pp. 1–8; 1996.

* cited by examiner

Primary Examiner—John F. Niebling
Assistant Examiner—Olivia T Luk
(74) Attorney, Agent, or Firm—Timothy M. Honeycutt

(57) ABSTRACT

A device stack for fabrication of an isolation structure and methods of fabricating the same are provided. In one aspect, a method of processing a substrate is provided that includes exposing the substrate to a plasma ambient containing nitrogen and oxygen to form a nitrogen containing interface. An oxide film is formed on the nitrogen containing interface and a silicon rich nitride film is formed on the oxide film. The silicon rich nitride film is exposed to a plasma ambient containing oxygen to convert an upper portion of the silicon rich nitride film to silicon oxynitride. The optical properties of the nitride film are enhanced so that UV lithographic patterning of etch masking is improved.

17 Claims, 4 Drawing Sheets

IN-SITU STACK FOR HIGH VOLUME PRODUCTION OF ISOLATION REGIONS

BACKGROUND OF THE INVENTION

1. Field of the Invention

This invention relates generally to semiconductor processing, and more particularly to a device stack for isolation structure fabrication and to methods of fabricating the same.

2. Description of the Related Art

The fabrication of electrical isolation structures, such as trench-based isolation structures, involves the sequential masking and etching of selected portions of a semiconductor substrate to establish therein a pattern of trenches in which bulk insulating material will be later deposited. Most trench etching processes involve rather lengthy plasma-based etching techniques that present the potential to significantly damage the portions of the underlying silicon substrate in which active circuit devices will be later fabricated. Accordingly, conventional trench-based isolation structure fabrication techniques normally include the fabrication of a pad oxide layer on the substrate surface and a relatively thick silicon nitride layer on top of the pad oxide layer. The purpose of the pad oxide and silicon nitride layers are twofold. First, the pad oxide layer provides a first film of protection over the silicon substrate. Oxide is usually selected for this role since oxide films exhibit better adhesion to silicon than do silicon nitride films. The silicon nitride protective layer exhibits relatively good adhesion to underlying oxide and, more importantly, is relatively resistant to chemical mechanical polishing ("CMP") of the later-deposited bulk insulating material, and thus provides a rather robust film to protect the underlying substrate during planarization. Both films protect the substrate from unintentional etching during trench formation.

In conventional processing, the oxide-nitride stack involves the first thermal oxidation or chemical vapor deposition ("CVD") of the oxide film followed by a CVD formation of the silicon nitride film. Many conventional processes utilize a thermal oxidation in order to provide the protective oxide film. This, of course, entails a high temperature process in either a rapid thermal processing context or a more conventional diffusion tube furnace process. In either case, some thermal budget is consumed and the integrity of the Si—$SiO_2$ interface is stressed to a certain extent. This may or may not be significant, depending upon the existing character of the interface. For example, if nitrogen has been introduced into the Si—$SiO_2$ interface, the thermal steps associated with oxide formation may degrade the quality of the nitrogen dispersal at the interface.

During development of the etched mask resist, standing waves may result in so-called "footing" in the edges of the patterned resist openings. In order to suppress the effects of standing waves, one conventional fabrication process modifies the optical properties of the silicon nitride film by depositing the silicon nitride film in a two-step process. In the first stage, low pressure CVD ("LPCVD") is used to establish the majority of the thickness of the nitride film. Thereafter, a silicon rich nitride film is established on the LPCVD nitride film, again by LPCVD, albeit with altered flow rates for silicon source and nitrogen source gases. The use of LPCVD again is a relatively high temperature process and thus consumes thermal budget. Furthermore, the LPCVD silicon nitride film, while having better optical properties than a comparable nonsilicon rich film, nevertheless tends to form with higher stresses than a plasma enhanced CVD ("PECVD") nitride film. Furthermore, the optical, that is, anti-reflective coating properties associated with the conventionally formed silicon rich nitride film seldom completely alleviate standing wave effects.

The present invention is directed to overcoming or reducing the effects of one or more of the foregoing disadvantages.

SUMMARY OF THE INVENTION

In accordance with one aspect of the present invention, a method of processing a substrate is provided that includes exposing the substrate to a plasma ambient containing nitrogen and oxygen to form a nitrogen containing interface. An oxide film is formed on the nitrogen containing interface and a silicon rich nitride film is formed on the oxide film. The silicon rich nitride film is exposed to a plasma ambient containing oxygen to convert an upper portion of the silicon rich nitride film to silicon oxynitride.

In accordance with another aspect of the present invention, a method of processing a substrate is provided that includes exposing the substrate to a plasma ambient containing nitrous oxide to form a nitrogen containing interface. An oxide film is formed on the nitrogen containing interface and a silicon rich nitride film is formed on the oxide film by plasma enhanced chemical vapor deposition. The silicon rich nitride film is exposed to a plasma ambient containing oxygen to convert an upper portion of the silicon rich nitride film to silicon oxynitride. A mask is formed on the silicon rich nitride film and an etch is performed through the silicon rich nitride film and the oxide film and into the substrate to form a trench therein.

In accordance with another aspect of the present invention, a circuit device is provided that includes a semiconductor substrate that has an upper surface with a nitrogen containing interface and a stack. The stack has an oxide film positioned on the nitrogen containing interface, a silicon rich nitride film positioned on the oxide film and an oxynitride film positioned on the silicon rich nitride film.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
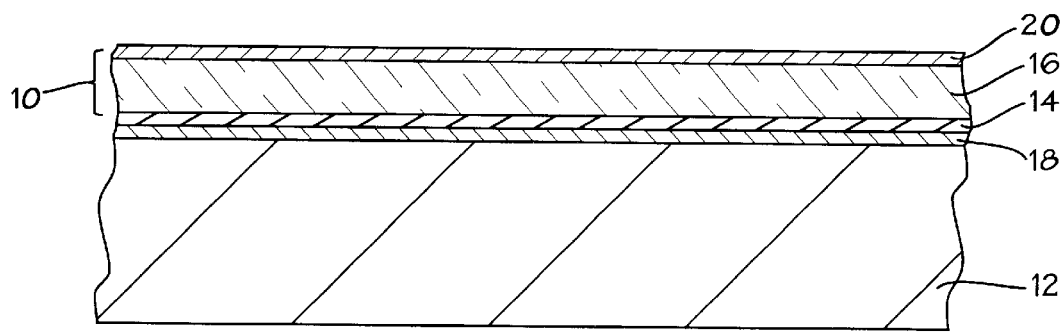
FIG. 1 is a cross-sectional view of an exemplary embodiment of a device stack fabricated on a semiconductor substrate in accordance with the present invention.

In the drawings described below, reference numerals are generally repeated where identical elements appear in more than one figure. FIG. 1 depicts a cross-sectional view of an exemplary embodiment of a device stack 10 fabricated on a semiconductor substrate 12 in accordance with the present invention that is suitable for high volume production of isolation structures in semiconductor processing. The substrate 12 may be composed of p-doped silicon, n-doped silicon, silicon-on-insulator or other suitable substrate materials. The stack 10 includes an oxide film 14 formed on the substrate 12 and a silicon nitride film 16 formed on the oxide film 14. During fabrication of the stack 10, the substrate 12 undergoes a plasma treatment in a nitrogen containing ambient to establish a nitrogen-containing oxide interface 18. The nitrogen-containing oxide interface 18 provides an interface between the substrate 12 and the overlying oxide film 14 that is more resistant to impurity migration and hot and cold carrier injection. The upper surface of the silicon nitride film 16 is similarly subjected to a plasma treatment in a nitrogen containing ambient to establish an oxynitride upper interface 20 thereon. The oxynitride interface 20 is provided to enhance the anti-reflective coating properties of the silicon nitride film 16 so that resolution during subsequent lithographic patterning is enhanced.

Figure 2:
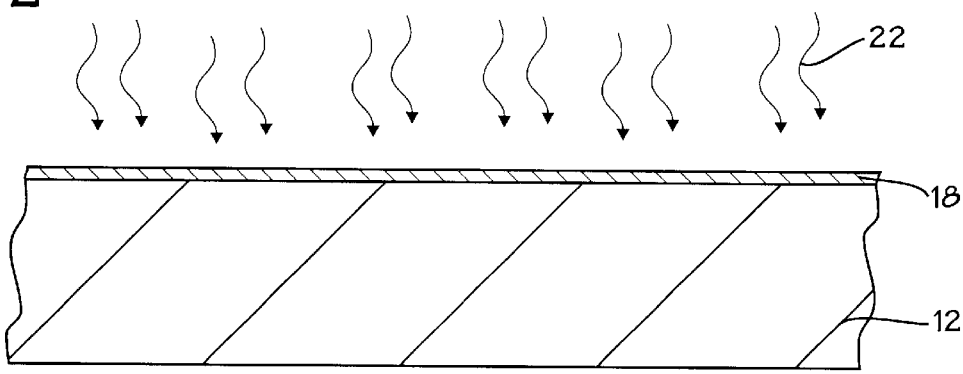
FIGS. 2–5 depict successive cross-sectional views of the substrate during fabrication of the stack of FIG. 1 in accordance with the present invention.

An exemplary process flow for fabricating the stack 10 in accordance with the present invention may be understood by referring now to FIGS. 2, 3, 4 and 5 and initially to FIG. 2. The substrate 12 is initially subjected to a plasma treatment in a nitrogen containing ambient in order to establish the nilrogen-containing oxide interface 18. The plasma ambient 22 may contain, for example, $N_2O$, NO, $NO_2$, mixtures of these or the like. In an exemplary embodiment, the substrate 12 is subjected to a $N_2O$ plasma under the following conditions:

TABLE 1

| Temperature | about 380 to 420° C. |
|---|---|
| Pressure | about 2.2 to 2.6 torr |
| High Frequency rf Power (@ 13.56 MHz) | about 700 to 800 watts |
| Nitrous Oxide Flow Rate | about 650 to 750 sccm |
| Temperature Soak Time | about 5 to 15 seconds |
| Treatment Time | about 20 to 60 seconds |

The foregoing process yields the nitrogen-containing oxide interface 18 with a thickness of about 2 to 10 Å and a composition of about 3 to 6% nitrogen by volume.

Figure 3:
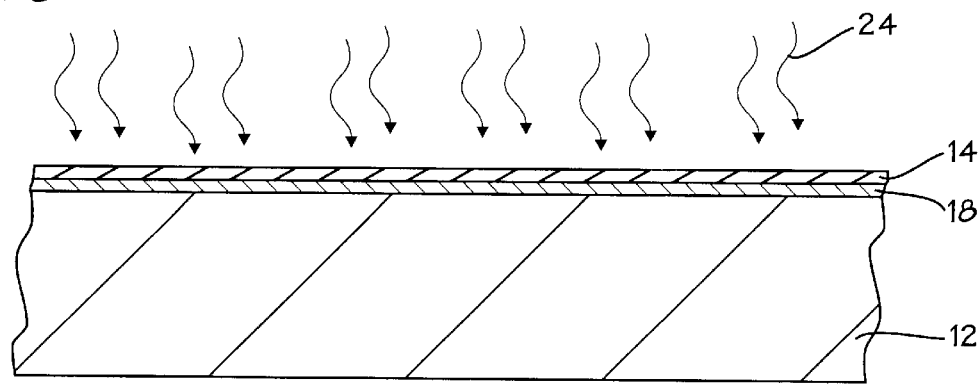

The fabrication of the oxide film 14 may be understood by referring now to FIG. 3. Plasma enhanced CVD is used to establish the conformal oxide film 14 to a thickness of about 20 to 100 angstroms. A plasma ambient 24 of a silicon source gas, such as silane or dichlorosilane mixed with an oxygen source gas, such as oxygen or nitrous oxide, is used to establish the CVD oxide film 14. The process conditions may be as follows:

TABLE 2

| Temperature | about 380 to 420° C. |
|---|---|
| Pressure | about 1.0 to 1.4 torr |
| High Frequency rf Power (@ 13.56 MHz) | about 310 to 350 watts |
| Silane Flow Rate | about 45 to 55 sccm |
| Nitrous Oxide Flow Rate | about 5800 to 6200 sccm |
| Nitrogen Flow Rate | about 2300 to 2700 sccm |
| Temperature Soak Time | about 20 to 40 seconds |

This PECVD oxide deposition process is desirable from two standpoints. First, the deposition may be performed in-situ immediately after the plasma treatment to establish the interface 18. In this way, the integrity of the nitrogen-containing oxide interface 18 may be substantially preserved prior to the oxide deposition. Second, the PECVD oxide deposition may be performed at a relatively low temperature, which, of course, results in less consumption of thermal budget.

Figure 4:
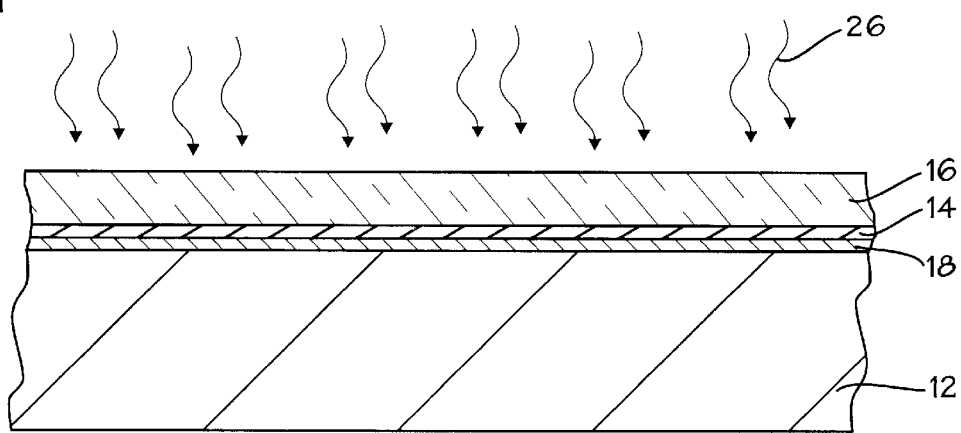
Figure 5:
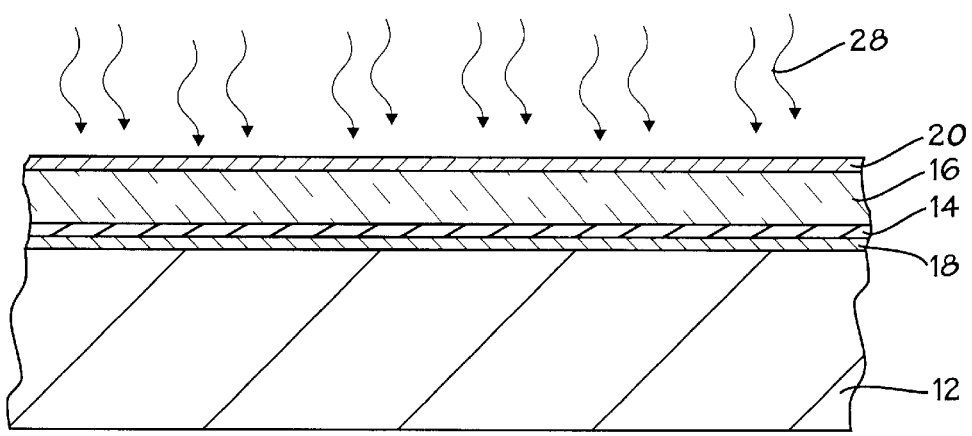

The fabrication of the silicon nitride film 16 and the oxynitride portion 20 thereof may be understood by referring now to FIGS. 4 and 5. A PECVD silicon nitride deposition process is performed to establish the silicon nitride film 16 with a silicon rich composition. The thickness of the film may be about 200 to 1000 angstroms. Again, a plasma ambient 26 of a silicon source gas, such as silane or disilane is mixed with a nitrogen source gas, such as ammonia, to establish the nitride film 16. The process conditions may be as follows:

TABLE 3

| Temperature | about 380 to 420° C. |
|---|---|
| Pressure | about 1.5 to 2.5 torr |
| High Frequency rf Power (@ 13.56 MHz) | about 200 to 400 watts |
| Low Frequency Power | about 100 to 200 watts |
| Silane Flow Rate | about 300 to 500 sccm |
| Ammonia Flow Rate | about 2000 to 4000 sccm |
| Nitrogen Flow Rate | about 2500 to 3500 sccm |
| Temperature Soak Time | about 25 to 35 seconds |

Experiments using the foregoing parameters have demonstrated surprisingly good results and suggest that a silane-to-ammonia ratio of about 0.075 to 0.25 is vital to obtaining a desirable silicon rich character for the nitride film 16.

As with the deposition of the oxide film 14, this PECVD process for depositing the silicon nitride film 16 is carried out at a relatively low temperature and thus results in lower stresses in the deposited nitride film 16. Furthermore, the silicon rich character of the film 16 provides enhanced anti-reflective coating properties for subsequent lithographic patterning using deep UV exposure and resists.

The anti-reflective coating properties of the silicon nitride film 16 are further enhanced by the establishment thereon of the oxynitride interface 20 by treatment in a plasma ambient 28 as shown in FIG. 5. The process conditions may be as follows:

TABLE 4

| Temperature | about 380 to 420° C. |
|---|---|
| Pressure | about 2.2 to 2.6 torr |
| High Frequency rf Power (@ 13.56 MHz) | about 700 to 800 watts |
| Nitrous Oxide Flow Rate | about 650 to 750 sccm |
| Treatment Time | about 20 to 60 seconds |
| Temperature Soak | about 10 to 30 seconds |

One goal of the plasma treatment is to provide the interface 20 with an extinction coefficient K of about 0.2 to 0.3 at a UV exposure wavelength of 193 nm. This range is believed to provide desired anti-reflective coating, that is, optical properties so that standing wave effects during resist exposure are diminished.

Note that the various processes to form the stack 10 involve plasma conditions and relatively low temperatures. This commonality of conditions suggests the possibility of fabricating the stack using in-situ processing. In this way, the interfaces, films etc. 14, 16, 18 and 20 may be fabricated without breaking vacuum. Better control over film contamination and native oxide formation is thus achievable.

Figure 6:
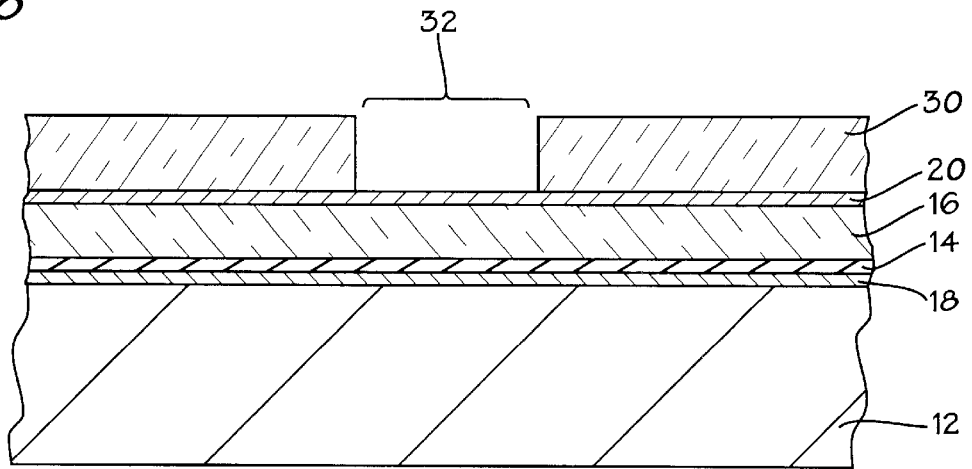
FIGS. 6–11 depict successive cross-sectional views of the substrate during fabrication of an exemplary isolation structure using the stack of FIG. 1 in accordance with present invention.

The fabrication of an exemplary isolation structure utilizing the stack 10 in accordance with the present invention may be understood by referring now to FIGS. 6, 7, 8, 9, 10 and 11 and initially to FIG. 6. A suitable etch mask 30 is patterned on the silicon nitride layer 16 of the stack 10 and provided with an opening 32 that corresponds to the desired floor plan or layout of the isolation structure to be formed. The etch mask 30 may consist of well-known photoresist materials and may be patterned using well-known lithography techniques. Note that the exposure of the photomask 30 is facilitated by the enhanced anti-reflective coating properties of not only the silicon rich nitride layer 16 but also the overlying oxynitride interface 20. In this way, the propensity for resist footing due to standing wave effects is reduced.

Figure 7:
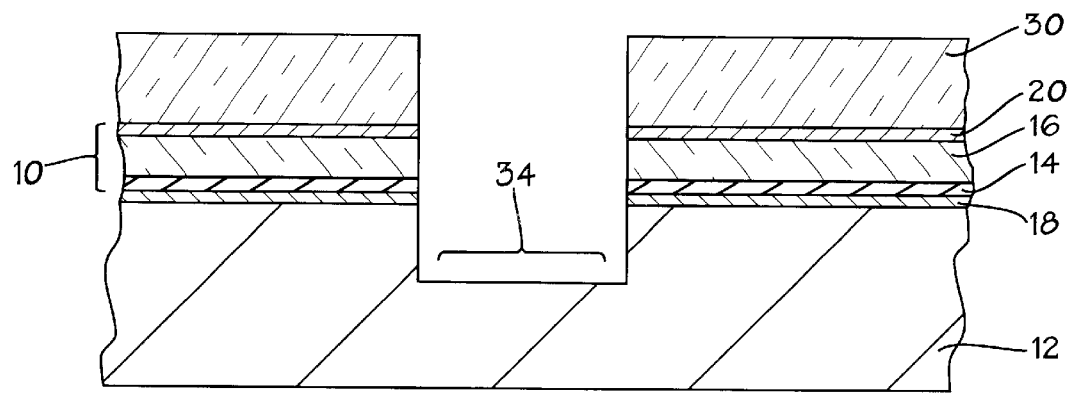

Referring now to FIG. 7, a trench 34 is etched through the stack 10 and into the substrate 12 as shown. The etch may be performed using well known reactive ion etching, chemical plasma etching or other well known anisotropic etching techniques and may use a variety of well-known chemistries suitable for etching silicon nitride, oxide and silicon. For example, for example, a $CF_4$ and $O_2$ plasma mixture may be used to etch the silicon nitride film 16 to the underlying field oxide 14 with a wafer chuck temperature of about 15° C. and a pressure of about 10 millitorr. Thereafter, the chemistry may be changed to a chemistry suitable for etching oxide, such as $CF_4$, and the oxide 14 etched again using the aforementioned temperature and pressure parameters. At the oxide etch endpoint, the chemistry may be changed to $SF_6$, HBr and $O_2$ to etch the silicon. The trench 34 may be etched to a depth of about 1,500 to 5,000 angstroms.

Figure 8:
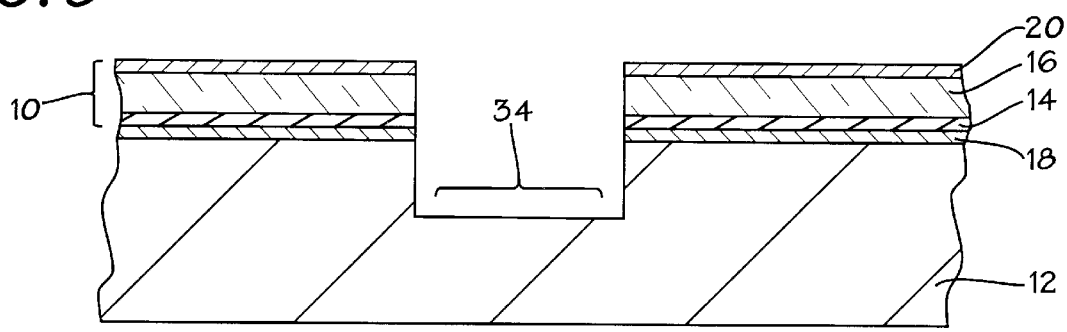

Following the etch definition of the trench 34, the resist layer 32 may be stripped by well-known ashing, solvent stripping or combinations of the two techniques as shown in FIG. 8. A cleaning step, such as well known RCA solvent techniques may follow resist strip.

Figure 9:
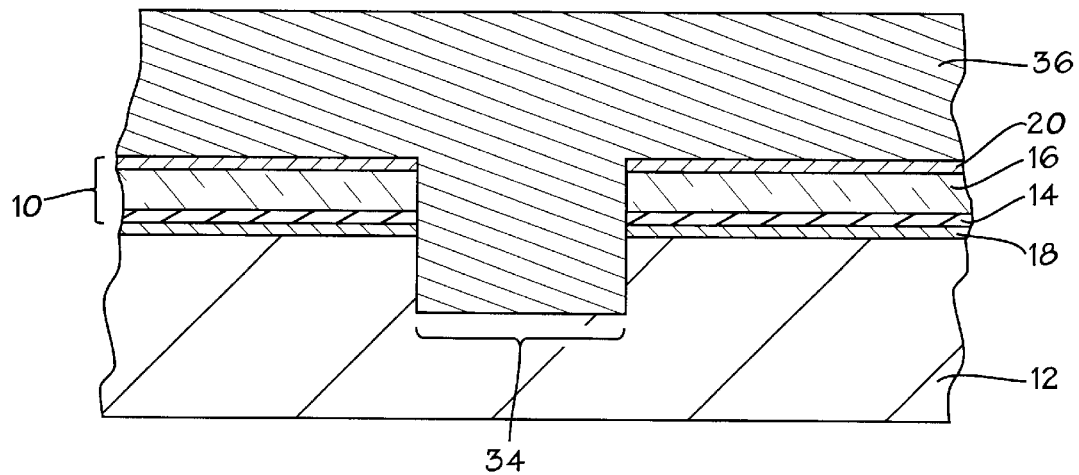

Referring now to FIG. 9, a bulk insulating material layer 36 is deposited over the silicon nitride layer 16 so as to fully fill the trench 34. The bulk insulating material layer 36 may have a thickness of about 3,000 to 10,000 angstroms. Various well-known insulating materials may be used, such as, for example, oxide, tetra-ethyl-ortho-silicate ("TEOS"), various doped glasses or the like. An exemplary embodiment, TEOS is the selected material. A post-deposition anneal may be performed to produce a densification of the film 36. For example, a rapid thermal anneal process may be performed at about 850 to 1000° C. for about 30 to 60 seconds. Optionally, a furnace process may be used at the same temperature range for about 30 to 60 minutes. A liner oxide film (not shown) may be optionally deposited prior to deposition of the film 365. However, it is anticipated the shortly after the initial stages of the deposition of the film 36, a relatively thin, perhaps 20 to 50 angstroms, oxide film will form in between the film 36 and the surfaces of the trench 34.

Figure 10:
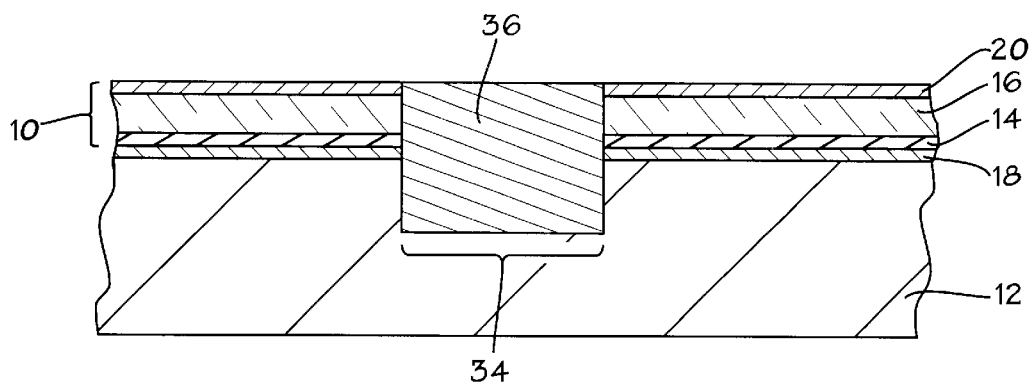

Referring now to FIG. 10, the bulk insulating film 36 is planarized to the silicon nitride film 16. As in conventional processes, the silicon nitride film 16 provides a robust protective layer to protect the underlying substrate 12 during this planarization process. The planarization may be by chemical mechanical polishing, etchback planarization or other well known planarization techniques. In an exemplary embodiment, CMP is used.

Figure 11:
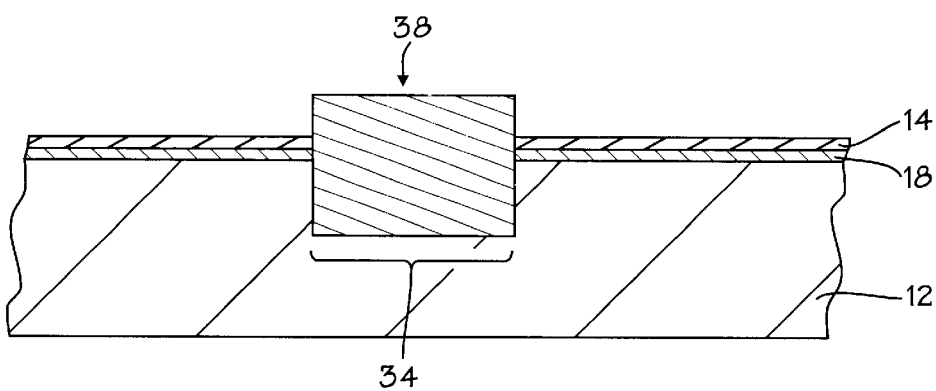

Referring now to FIG. 11, the silicon nitride film 16 shown in FIG. 10 may be stripped using, for example, a hot phosphoric acid dip or a plasma etch process as desired. The underlying oxide film 14 may be left in place at this point to maintain protection of the underlying substrate 12 as shown in FIG. 11 or may be optionally stripped away using, for example, a HF dip or a plasma etch process as desired. In either event, the isolation structure 38 is now formed and the substrate 12 may undergo further processing to establish circuit devices or other structures thereon depending upon the particular process flow desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of processing a substrate, comprising:
 exposing the substrate to a plasma ambient containing nitrogen and oxygen to form a nitrogen containing interface;
 forming an oxide film on the nitrogen containing interface;
 forming a silicon rich nitride film on the oxide film; and
 exposing the silicon rich nitride film to a plasma ambient containing oxygen to convert an upper portion of the silicon rich nitride film to silicon oxynitride.

2. The method of claim 1, comprising forming a mask on the silicon rich nitride film and etching through the silicon rich nitride film and the oxide film and into the substrate to form a trench therein.

3. The method of claim 2, comprising filling the trench with an insulating material to form an isolation structure.

4. The method of claim 1, wherein the silicon rich nitride film is formed by plasma enhanced chemical vapor deposition with an ambient containing silane and ammonia.

5. The method of claim 4, wherein the ratio of silane flow to ammonia flow is about 0.3 to 0.4.

6. The method of claim 1, wherein the plasma ambient containing oxygen further comprises a nitrogen bearing species.

7. The method of claim 6, wherein the nitrogen bearing species comprises $N_2O$, $NO$ or $NO_2$.

8. The method of claim 1, wherein the nitrogen containing interface, the oxide film, the silicon rich nitride film, and silicon oxynitride are formed without breaking vacuum.

9. A method of processing a substrate, comprising:
 exposing the substrate to a plasma ambient containing nitrous oxide to form a nitrogen containing interface;
 forming an oxide film on the nitrogen containing interface;
 forming a silicon rich nitride film on the oxide film by plasma enhanced chemical vapor deposition;
 exposing the silicon rich nitride film to a plasma ambient containing oxygen to convert an upper portion of the silicon rich nitride film to silicon oxynitride;
 forming a mask on the silicon rich nitride film; and
 etching through the silicon rich nitride film and the oxide film and into the substrate to form a trench therein.

10. The method of claim 9, comprising filling the trench with an insulating material to form an isolation structure.

11. The method of claim 9, wherein the silicon rich nitride film is formed by plasma enhanced chemical vapor deposition with an ambient containing silane and ammonia.

12. The method of claim 11, wherein the ratio of silane flow to ammonia flow is about 0.3 to 0.4.

13. The method of claim 9, wherein the plasma ambient containing oxygen further comprises a nitrogen bearing species.

14. The method of claim 13, wherein the nitrogen bearing species comprises $N_2O$, $NO$ or $NO_2$.

15. The method of claim 9, wherein the nitrogen containing interface, the oxide film, the silicon rich nitride film, and silicon oxynitride are formed without breaking vacuum.

16. The method of claim 1, wherein the oxide film is formed by plasma enhanced chemical vapor deposition.

17. The method of claim 9, wherein the oxide film is formed by plasma enhanced chemical vapor deposition.

* * * * *

UNITED STATES PATENT AND TRADEMARK OFFICE
CERTIFICATE OF CORRECTION

PATENT NO.    : 6,383,874 B1  
DATED         : May 7, 2002  
INVENTOR(S)   : Sey-Ping Sun et al.

Page 1 of 1

It is certified that error appears in the above-identified patent and that said Letters Patent is hereby corrected as shown below:

<u>Title page,</u>  
Item [56], References Cited, OTHER PUBLICATIONS, insert -- Harry J. Levinson; Principles of Lithography; pp. 121-132; 2001 --.

Signed and Sealed this

Twenty-ninth Day of October, 2002

*Attest:*

JAMES E. ROGAN  
*Attesting Officer*     *Director of the United States Patent and Trademark Office*